United States Patent
Condorelli et al.

(10) Patent No.: US 11,869,536 B2
(45) Date of Patent: Jan. 9, 2024

(54) AUTO MUTE FEATURE USING A VOICE ACCELEROMETER AND A MICROPHONE

(71) Applicant: Qualcomm Technologies Inc., SAn Diego, CA (US)

(72) Inventors: Roberto Condorelli, Boston, MA (US); Lorenzo Ponzanelli, Boston, MA (US); Shin Nagpal, Boston, MA (US)

(73) Assignee: QUALCOMM Technologies, Inc., San Diego, CA (US)

( * ) Notice: Subject to any disclaimer, the term of this patent is extended or adjusted under 35 U.S.C. 154(b) by 203 days.

(21) Appl. No.: 17/339,709

(22) Filed: Jun. 4, 2021

(65) Prior Publication Data

US 2021/0383824 A1    Dec. 9, 2021

Related U.S. Application Data

(60) Provisional application No. 63/034,832, filed on Jun. 4, 2020.

(51) Int. Cl.
| | | |
|---|---|---|
| G10L 15/22 | (2006.01) | |
| G10L 25/78 | (2013.01) | |
| H03G 3/34 | (2006.01) | |

(52) U.S. Cl.
CPC .............. G10L 25/78 (2013.01); G10L 15/22 (2013.01); H03G 3/34 (2013.01); *G10L 2025/783* (2013.01); *H04R 2201/003* (2013.01)

(58) Field of Classification Search
CPC ... G10L 15/22; G10L 25/78; G10L 2025/783; G10L 2025/786; G10L 2035/935; G10L 25/93; H03G 3/34; H03G 3/345; H03G 2201/003
See application file for complete search history.

(56) References Cited

U.S. PATENT DOCUMENTS

| | | | | |
|---|---|---|---|---|
| 8,311,196 | B2 * | 11/2012 | Hanson ............... | H04M 3/4285 |
| | | | | 709/227 |
| 10,396,742 | B2 * | 8/2019 | Shiozawa ............ | H04B 1/1027 |
| 10,530,927 | B2 * | 1/2020 | VanBlon ................. | G10L 17/22 |
| 11,114,115 | B2 * | 9/2021 | Gupta ..................... | G10L 25/78 |
| 11,189,275 | B2 * | 11/2021 | Irukuvajhula ........... | G10L 15/22 |
| 2015/0201278 | A1 * | 7/2015 | Bao ......................... | H04R 3/005 |
| | | | | 381/92 |
| 2019/0281393 | A1 * | 9/2019 | Grosh .................... | H04R 17/02 |
| 2020/0043486 | A1 * | 2/2020 | Irukuvajhula ........... | G10L 15/22 |
| 2020/0344555 | A1 * | 10/2020 | Littrell ................ | H04R 17/025 |
| 2020/0401365 | A1 * | 12/2020 | Wilberding ............ | G10L 25/51 |
| 2020/0408799 | A1 * | 12/2020 | Littrell ................. | H10N 30/302 |
| 2021/0337308 | A1 * | 10/2021 | Kuthuru .................. | G10L 15/22 |
| 2021/0383824 | A1 * | 12/2021 | Condorelli ............. | G10L 25/78 |

* cited by examiner

Primary Examiner — Vijay B Chawan
(74) Attorney, Agent, or Firm — QUALCOMM Technologies, Inc.

(57) ABSTRACT

Techniques for automatically muting or unmuting an acoustic transducer include receiving a signal representing an output by a voice accelerometer of a device, determining whether the signal is indicative of a presence or absence of voice activity by a user of the device, and generating a control signal that causes an acoustic transducer to be muted responsive to determining that the signal is indicative of an absence of voice activity by the user, or that causes the acoustic transducer to be unmuted response to determining that the signal is indicative of a presence of voice activity by the user.

18 Claims, 11 Drawing Sheets

AUTO MUTE FEATURE USING A VOICE ACCELEROMETER AND A MICROPHONE

PRIORITY

This application claims priority to and the benefit of U.S. Provisional Patent Application No. 63/034,832, filed Jun. 4, 2020, the entire contents of which is incorporated herein by reference.

TECHNICAL FIELD

This disclosure relates generally to techniques for automatically muting or unmuting a microphone based on signals produced by a voice accelerometer or the microphone, or both.

BACKGROUND

Many conference calls are disrupted when a user forgets to mute or unmute their microphone. For example, if a user forgets to mute their microphone when they are not speaking, the background noise from the user can potentially overwhelm and disrupt the audio from other users on the call. On the other hand, if a user forgets to unmute their microphone when they are speaking, their voice is not heard by others on the call, leading to disruptions as the user is forced to repeat themselves. Some conference call solutions attempt to reduce disruptions by providing a visual indication of the microphone's status so that a user is reminded to manually mute or unmute their microphone as appropriate, or by alerting a user to manually unmute their microphone if the system determines from the microphone signal that the user is speaking. However, manual control of the mute function relies on action by the user and can result in an unpleasant conference call experience when the user forgets to appropriately set the microphone's status.

SUMMARY

In general, in an aspect, a method performed by at least one processor includes receiving a signal representing an output by a voice accelerometer of a device, determining whether the signal is indicative of a presence or an absence of voice activity by a user of the device, and in response to determining that the signal is indicative of an absence of voice activity by the user, generating a control signal that causes the acoustic transducer to be muted. In some examples, the method includes generating a control signal that causes an acoustic transducer to be unmuted in response to determining that the signal is indicative of a presence of voice activity by the user.

In general, in an aspect, a device includes at least one processor and at least one computer-readable storage medium storing instructions that are executable by the at least one processor to perform operations including receiving a signal representing an output by a voice accelerometer, determining whether the signal is indicative of a presence or an absence of voice activity, and in response to determining that the signal is indicative of an absence of voice activity, generating a control signal that causes an acoustic transducer to be muted. In some examples, the operations include generating a control signal that causes an acoustic transducer to be unmuted in response to determining that the signal is indicative of a presence of voice activity by the user.

In general, in an aspect, one or more non-transitory computer-readable storage medium storing instructions that are executable by at least processor to perform operations including receiving a signal representing an output by a voice accelerometer of a device, determining whether the signal is indicative of a presence or an absence of voice activity by a user of the device, and in response to determining that the signal is indicative of an absence of voice activity by the user, generating a control signal that causes an acoustic transducer to be muted. In some examples, the operations include generating a control signal that causes an acoustic transducer to be unmuted in response to determining that the signal is indicative of a presence of voice activity by the user.

Implementations of one or more of the above aspects can include one or more of the following features.

In some examples, the signal representing the output by the voice accelerometer is a first signal, and the operations include receiving a second signal representing an output by the acoustic transducer of the device, determining a correlation between the first signal and the second signal, and based on the correlation, generating, by the at least one processor, a control signal that causes the acoustic transducer to be muted or unmuted. In some examples, a control signal that causes the acoustic transducer to be unmuted is generated in response to the correlation satisfying the threshold value.

In some examples, determining whether the signal is indicative of a presence or an absence of voice activity includes comparing an amplitude of at least a portion of the signal with a threshold value. In some examples, in response to the amplitude of at least a portion of the signal satisfying the threshold value, an amplitude or energy at one or more particular frequencies of the signal is compared with a threshold value to determine whether the signal is indicative of a presence or an absence of voice activity by the user. In some examples, in response to the amplitude of at least a portion of the signal satisfying the threshold value, a voice activity detection algorithm is applied to the signal to determine whether the signal is indicative of a presence or an absence of voice activity by the user.

In some examples, the device includes the at least one processor. In some examples, the at least one processor is included in another device that is distinct from the device. The acoustic transducer can be a piezoelectric micro-electromechanical system (MEMS) microphone. The voice accelerometer can be a piezoelectric MEMS voice accelerometer. In some examples, the voice accelerometer generates the signal by detecting vibrations of the vocal chords of the user through the device.

In some examples, the control signal controls a hardware or software switch to cause the acoustic transducer to be muted. In some examples, the control signal causes the device or another device to display an audio or visual indication that the acoustic transducer is muted or unmuted.

The details of one or more implementations are set forth in the accompanying drawings and the description below. The techniques described here can be implemented by one or more systems, devices, methods, or non-transitory computer-readable media, among others. Other features and advantages will be apparent from the description and drawings, and from the claims.

BRIEF DESCRIPTION OF DRAWINGS

Like reference symbols in the various drawings indicate like elements.

DETAILED DESCRIPTION

Conference calls and other voice applications are prone to disruptions when a user forgets to mute their microphone when they are not speaking or unmute their microphone when they are speaking. The technology described here addresses these and other concerns by automatically muting or unmuting a user's microphone based on signals received from a voice accelerometer or the microphone, or both. In particular, the technology processes the signal from the voice accelerometer alone or in combination with the signal from the microphone to detect voice activity by the user. If voice activity is detected, the technology automatically unmutes the user's microphone. Otherwise, if no voice activity is detected, the technology automatically mutes the user's microphone. In this manner, the technology reduces disruptions and improves the user experience relative to systems which rely on the user to manually adjust their microphone. In addition, by using a voice accelerometer to detect voice activity, the technology achieves greater accuracy relative to techniques that rely solely on the microphone signal and are prone to responding to background noise.

Figure 1:
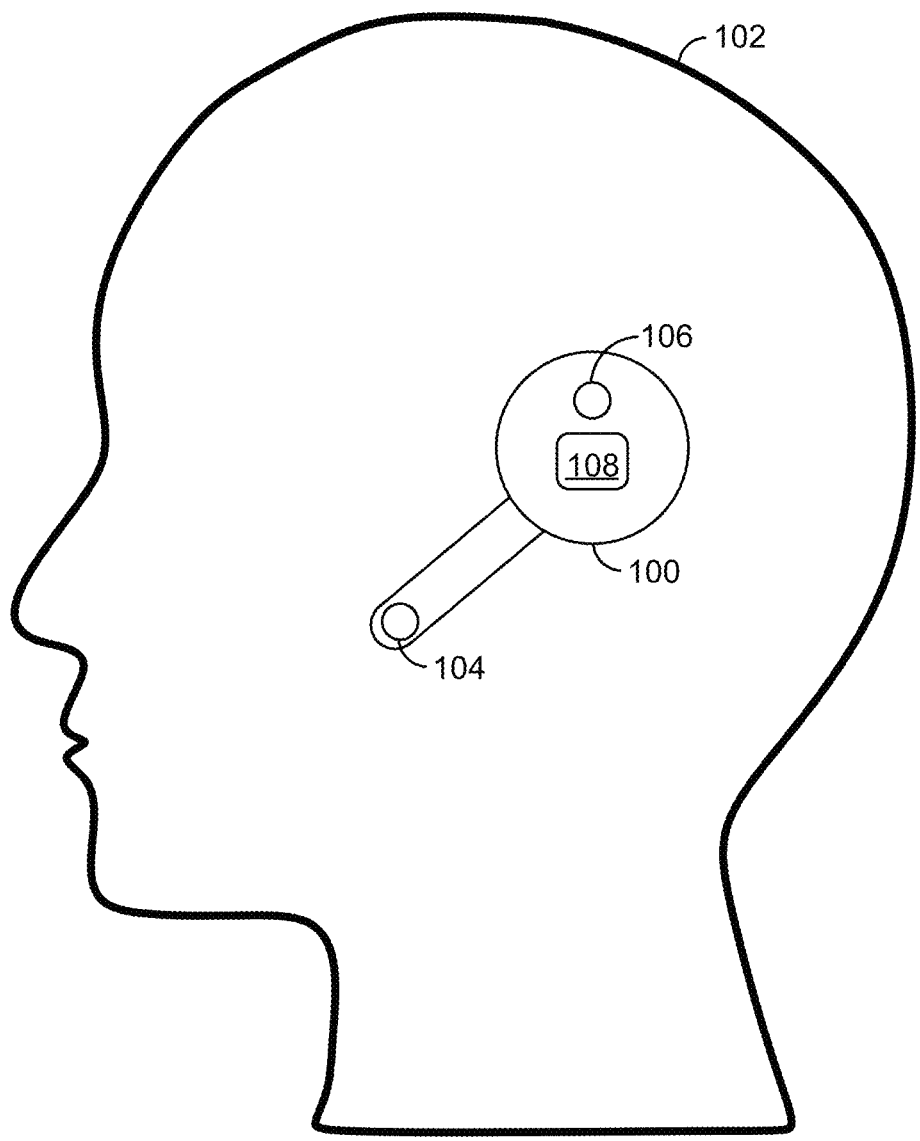
FIG. 1 illustrates an example device for automatically muting or unmuting an acoustic transducer.

FIG. 1 illustrates a device 100 for automatically muting or unmuting an acoustic transducer in accordance with an aspect of the present disclosure. In this example, the device 100 is a headset device worn by a user 102. In other examples, the device 100 can be another device worn by or otherwise in contact with the user 102, such as headphones, earbuds, a wearable device (e.g., a smartwatch, smartglasses, etc.), or a mobile device (e.g., a smartphone) placed in contact with the user's ear, among others.

As shown in FIG. 1, the device 100 includes an acoustic transducer 104, an accelerometer 106, and a controller 108. The acoustic transducer 104 can be a microphone that senses the voice of the user 102 and other acoustic stimuli (e.g., background noise) in a vicinity of the device 100. The user 102 of the device 100 can use the acoustic transducer 104 to convey speech to an application or service (e.g., a conference call application or service) executing on the device 100 or another device that is communicatively coupled to the device 100. In some examples, the acoustic transducer 104 is a piezoelectric MEMS microphone, such as those produced by Vesper Technologies of Boston, MA and described in U.S. patent application Ser. No. 16/353,934, titled "Acoustic Transducer with Gap-Controlling Geometry and Method of Manufacturing an Acoustic Transducer," the entire contents of which is incorporated herein by reference. In other examples, the acoustic transducer 104 is a condenser microphone (sometimes referred to as a capacitive microphone), a dynamic microphone, or another transducer capable of converting sound into an electrical signal.

The accelerometer 106 can be a voice accelerometer (sometimes referred to as a bone conduction sensor) configured to sense vibrations that are transmitted from the vocal chords of the user 102 while the user is speaking, through the bones and/or tissue in, for example, the user's head, and to the device 100. As described herein, the signal produced by the voice accelerometer 106 can be processed (either alone or in combination with the signal produced by the acoustic transducer 104) to detect when the user 102 is speaking. In some examples, the voice accelerometer 106 is a piezoelectric micro-electromechanical system (MEMS) voice accelerometer, such as those produced by Vesper Technologies of Boston, MA and described in U.S. patent application Ser. No. 16/900,185, titled "Piezoelectric Accelerometer with Wake Function," the entire contents of which is incorporated herein by reference. In other examples, the voice accelerometer 106 is a capacitive accelerometer, a piezoresistive accelerometer, or another transducer capable of converting vibrations into an electrical signal.

The controller 108 can include one or more processing components (e.g., a central processing unit (CPU), an application specific integrated circuit (ASIC), a logic circuit, or combinations of them, among others) and one or more storage components (e.g., volatile memory, non-volatile memory, a hard drive, or combinations of them, among others). In some examples, the controller 108 and its underlying components are included in the device 100, as shown in FIG. 1. In other examples, the controller 108 and some or all of its underlying components are included in another device distinct from the device 100, such as shown FIG. 7.

In general, the controller 108 processes the signals produced by the acoustic transducer 104 and/or the accelerometer 106 to detect voice activity by the user 102. If the controller 108 determines that one or both of the signals from the acoustic transducer 104 and the accelerometer 106 are indicative a presence of voice activity by the user 102, the controller 108 can generate a control signal configured to unmute an acoustic transducer of the device 100 (e.g., the acoustic transducer 104) or another device. For example, the control signal can control a hardware or software switch on the device 100 or another coupled device to cause the acoustic transducer to be unmuted (or muted). On the other hand, if the controller 108 determines that one or both of the signals from the acoustic transducer 104 and the accelerometer 106 are not indicative of voice activity (e.g., indicative of an absence of voice activity) by the user 102, the controller 108 can generate a control signal configured to mute an acoustic transducer of the device 100 or another device. By automatically muting or unmuting the acoustic transducer based on the presence or absence of voice activity by the user 102, the controller 108 reduces disruptions during, for example, a conference call relative to techniques that rely on manual adjustment by the user 102, thereby improving the user experience.

Figure 2:
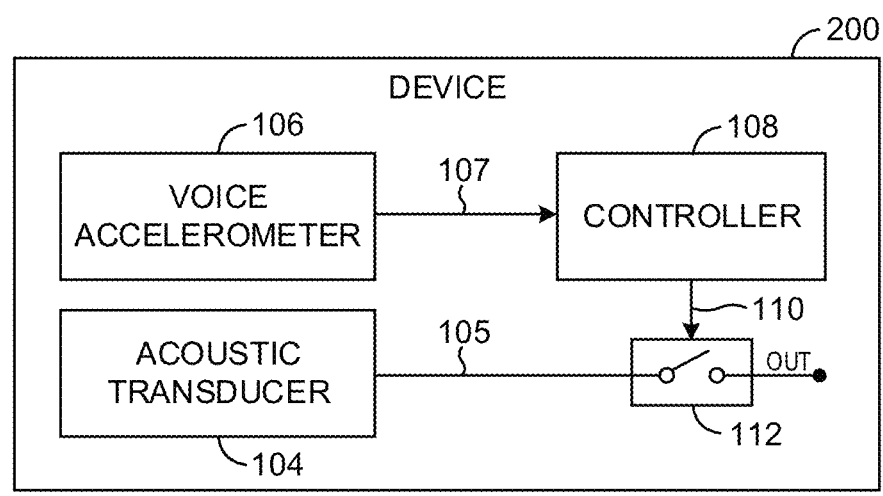
FIG. 2 illustrates an example device for automatically muting or unmuting an acoustic transducer.

Referring to FIG. 2, a device 200 for automatically muting or unmuting an acoustic transducer based on a signal from a voice accelerometer 106 is shown. The device 200 can be an implementation of the device 100 in accordance with an aspect of the present disclosure. In this example, the acoustic transducer 104 senses the voice of the user 102 and other acoustic stimuli and produces a signal 105 representing the sensed acoustic input. The voice accelerometer 106 senses vibrations emanating from the vocal chords of the user 102 and produces a signal 107 representing the sensed vibrations.

The controller 108 receives and processes the signal 107 to detect voice activity by a user of the device 200. For example, the controller 108 can compare one or more features of the signal 107, such as an amplitude of the signal, an energy of the signal, or both, among others, with one or more thresholds. If some or all of the features of the signal 107 satisfy (e.g., exceed) a corresponding threshold, the controller 108 can determine that the user of the device 200 is speaking. On the other hand, if some or all of the features do not satisfy (e.g., are less than) a corresponding threshold, the controller 108 can determine that the user is not speaking. In some examples, the controller 108 can compare one of more features of the signal 107 within a particular frequency band, such as a frequency band from about 100 Hz to about 700 Hz or another frequency band within the range of human voice, with one or more thresholds to detect voice activity by the user of the device 200. In some examples, the controller 108 can apply a voice activity detection algorithm to the signal 107 to detect voice activity by the user of the device 200. Such an algorithm can first extract features from the signal 107, such as number of zero crossings, relative amplitude levels in different frequency bands, changes in levels over time, energy, power, signal-to-noise ratio, pitch, or combinations of them, among others. The algorithm can then apply a detection scheme (e.g., thresholds, a Gaussian mixture model or another probabilistic model, a neural network or another machine learning model, or combinations of them, among others) to detect the presence or absence of voice activity.

Figure 6:
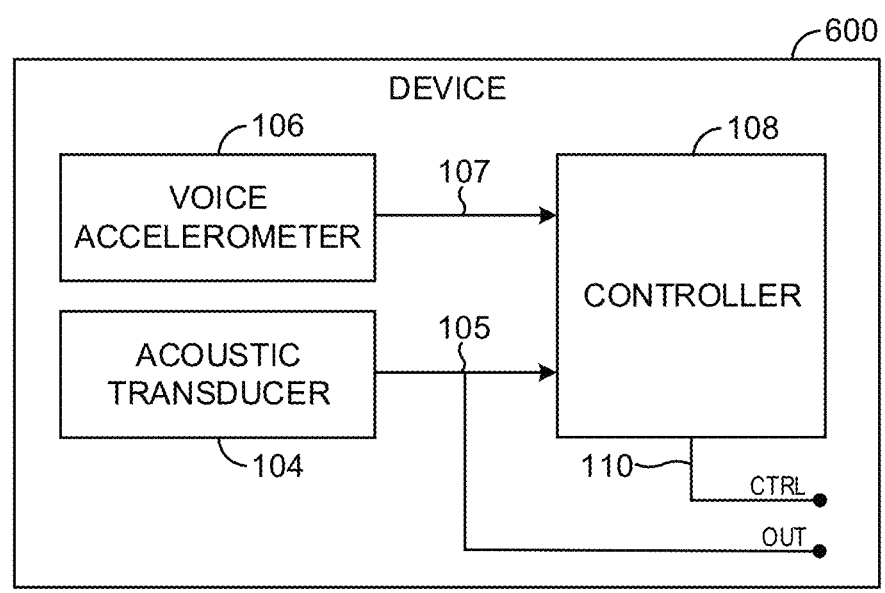
FIGS. 6-9 illustrate example devices for automatically muting or unmuting an acoustic transducer.

If the controller 108 determines that the user of the device 200 is speaking based on analysis of the signal 107, then the controller 108 can unmute the acoustic transducer 104. For example, the controller 108 can generate a control signal 110 that causes a hardware or software switch 112 to close and allow output of the signal 105 to an application or service executing on the device 200 or another coupled device. On the other hand, if the controller 108 determines that the user of the device 200 is not speaking based on analysis of the signal 107, then the controller 108 can mute the acoustic transducer 104 by, for example, generating a control signal 110 that causes the switch 112 to open and prevent output of the signal 105. In some examples, the controller 108 can mute or unmute the acoustic transducer 104 through means other than the switch 112, such as by enabling or disabling the acoustic transducer 104, or by outputting the control signal 110 to an application or service executing on the device 200 or another coupled device for facilitating the auto-mute feature within the application or service, as shown in FIG. 6.

Figure 3A:
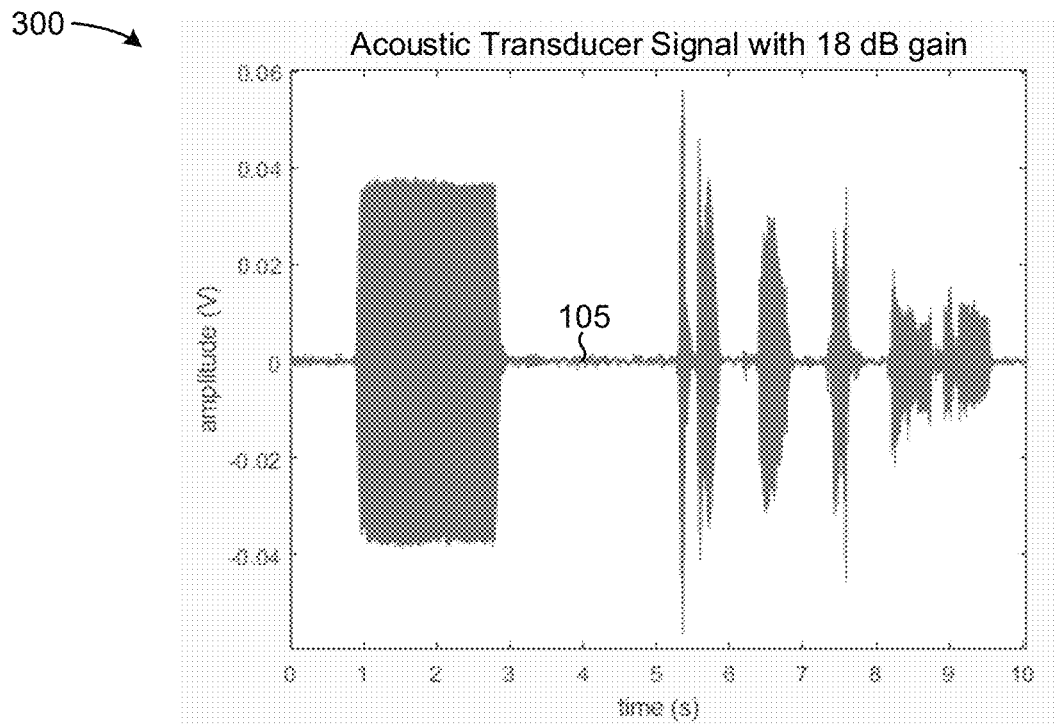
FIG. 3A illustrates an example graph of an acoustic transducer signal.
Figure 3B:
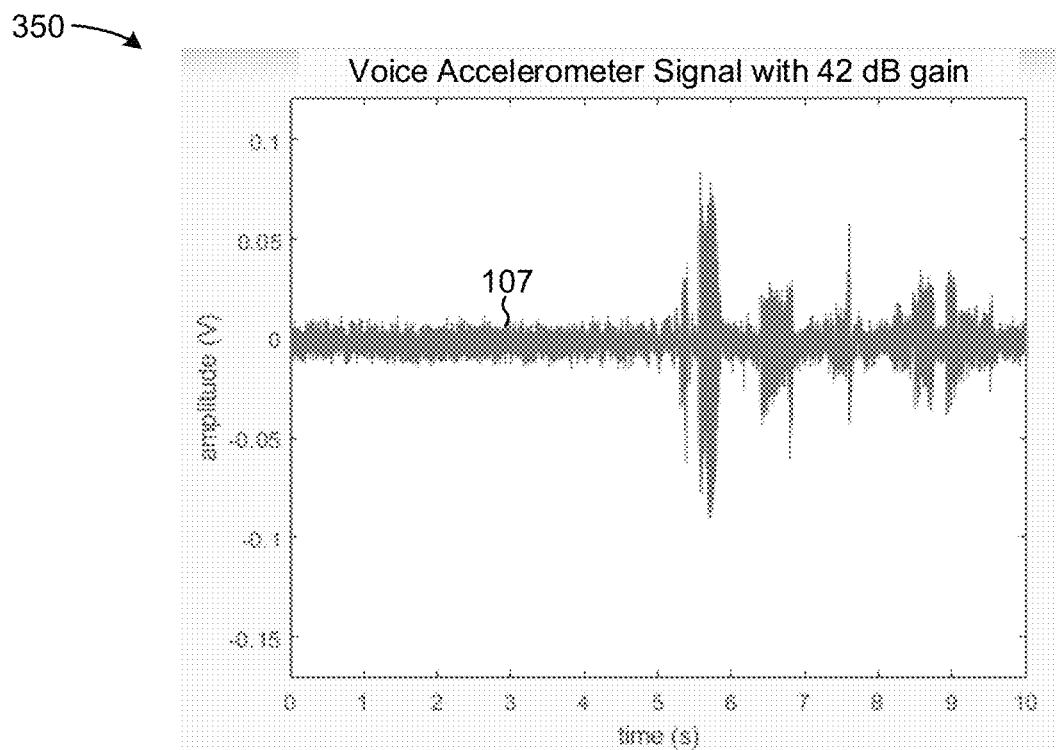
FIG. 3B illustrates an example graph of a voice accelerometer signal.

Because the voice accelerometer 106 is not sensitive to background noise or other ambient sounds, its signal 107 can be used to provide an accurate indication of whether or not the user of the device 200 is speaking. For example, referring to FIG. 3A, a graph 300 of a signal 105 from the acoustic transducer 104 is shown. In this example, a 1 kHz tone with a sound pressure level of 94 dB in a vicinity of the device 200 is sensed by acoustic transducer 104 during seconds 1 to 3. However, this same tone is not detected by the voice accelerometer 106 as shown in the corresponding graph 350 of the signal 107 in FIG. 3B. This comparison demonstrates that the voice accelerometer 106 is immune to air conducted sound, thus allowing for more accurate detection of voice activity in the presence of background noise. The signal 107 from the voice accelerometer 106 also has a relatively stationary noise floor, which can enable voice activity detection to be implemented using a relatively simple short-term energy analysis of the signal 107.

Figure 4:
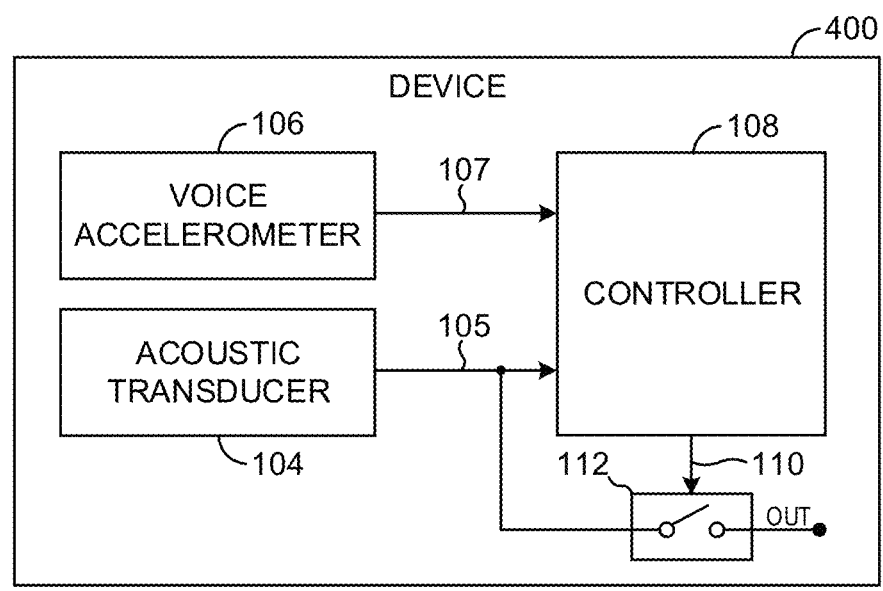
FIG. 4 illustrates an example device for automatically muting or unmuting an acoustic transducer.
Figure 5:
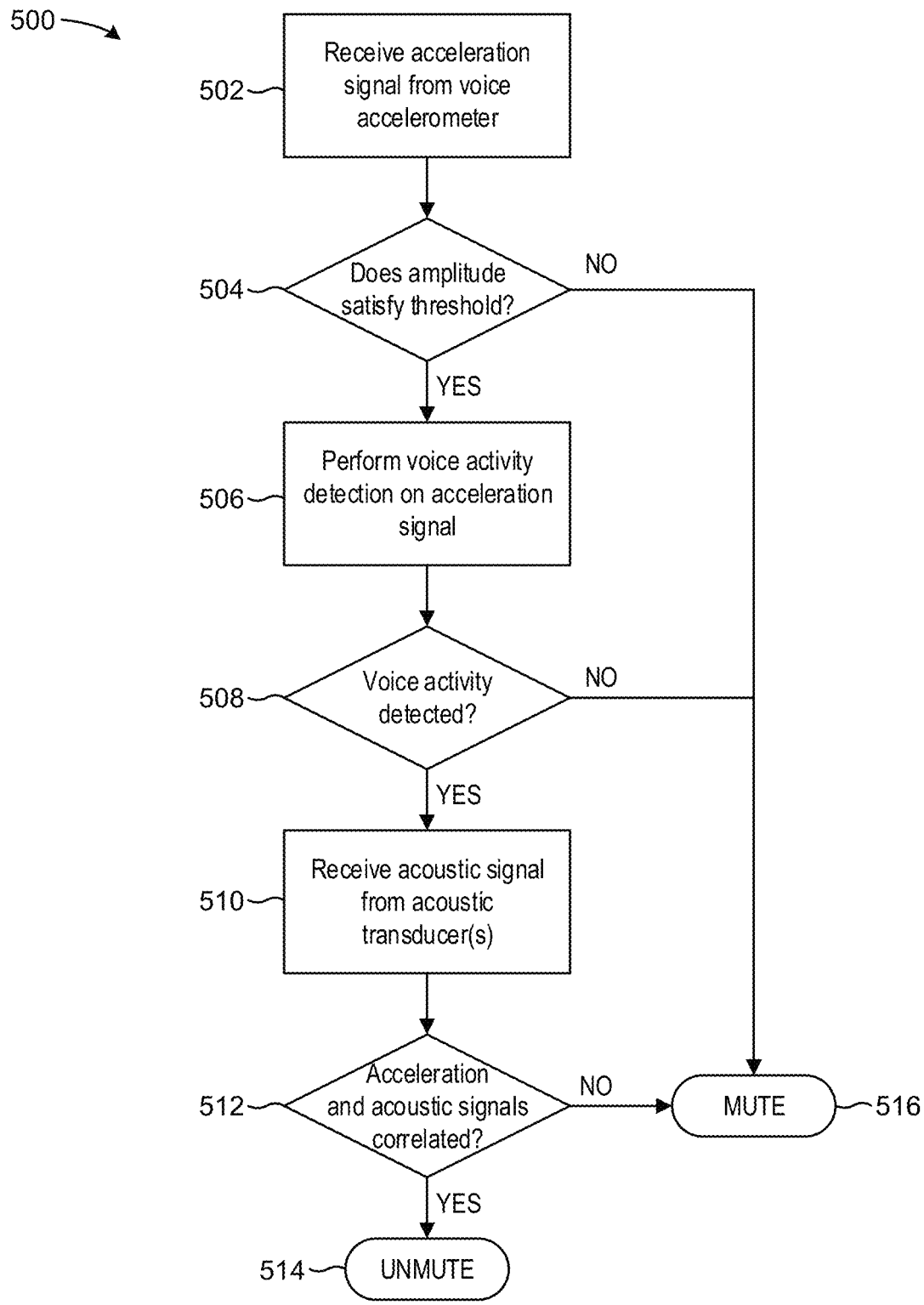
FIG. 5 illustrates an example process for detecting voice activity.

In some examples, voice activity detection can be further improved by combining analysis of the signal from the voice accelerometer 106 with the signal from the acoustic transducer 104. Referring to FIG. 4, a device 400 for automatically muting or unmuting an acoustic transducer based on signals from an acoustic transducer 104 and a voice accelerometer 106 is shown. The device 400 can be an implementation of the device 100 in accordance with an aspect of the present disclosure. In this example, the controller 108 receives and processes the signals 105, 107 from both the acoustic transducer 104 and the voice accelerometer 106 to detect voice activity by a user of the device 200. To perform such processing, the controller 108 can carry out some or all of the process 500 shown in FIG. 5. Initially, the controller 108 receives 502 the acceleration signal 107 produced by the voice accelerometer 106. At 504, the controller 108 determines whether the amplitude (or another feature) of the signal 107 satisfies a threshold value. If it does not, the controller 108 determines that there is no voice activity at the device 400 and proceeds to mute 516 the output signal 105 of the acoustic transducer 104. On the other hand, if the threshold is satisfied, the controller 108 performs 506 voice activity detection on the signal 107. In some examples, the controller 108 performs the analysis by determining whether one or more features (e.g., amplitude or energy) of the signal 107 within a particular frequency band (e.g., about 100 Hz to about 700 Hz or another frequency band within the range of human voice) satisfies a corresponding threshold value. In some examples, the controller 108 performs the analysis by applying a voice detection algorithm as described herein.

At 508, the controller 108 determines whether the results of the analysis at 506 are indicative of voice activity by a user of the device 400. If the controller 108 determines that there is no voice activity, the controller 108 mutes 516 the acoustic transducer 104. Conversely, if the controller 108 determines that there is voice activity, the controller 108 receives 510 the acoustic signal 105 from the acoustic transducer 104. The controller 108 processes the acoustic signal 105 and the acceleration signal 107 to determine whether there is a correlation between the signals. For example, the controller 108 can compute a cross-correlation (e.g., sliding dot product) of the signals 105, 107, calculate an error (e.g., mean-squared error) between the signals 105, 107, or perform another similarity analysis to determine a similarity between the two signals. At 512, the controller 108 can determine whether the signals 105, 107 are correlated by, for example, comparing the measured similarity with a threshold value. If the controller 108 determines that there is sufficient correlation between the signals 105, 107, the controller 108 can conclude that there is voice activity at the device 400 and can unmute 514 the acoustic transducer 104. If there is insufficient correlation between the signals 105, 107, then the controller 108 can mute 516 the acoustic transducer 104.

FIGS. 6 through 9 illustrate additional implementations of the devices described herein for automatically muting or unmuting an acoustic transducer. Although each of FIGS. 6 through 9 (as well as the other figures) highlight certain features of a particular implementation, it should be noted that the features can be combined with other features described herein in some implementations. Referring to FIG. 6, a device 600 for automatically muting or unmuting an acoustic transducer based on signals from an acoustic transducer 104 and a voice accelerometer 106 is shown. In this example, the signal 105 from the acoustic transducer 104 and the control signal 110 are output to an application or service executing on the device 600 or another coupled device for facilitating the auto-mute feature within the application or service (rather than, e.g., muting or unmuting the signal 105 via the switch 112). In some examples, the application or service can use the control signal 110 to provide a visual or audible indication that the acoustic transducer 104 is muted or unmuted.

Figure 7:
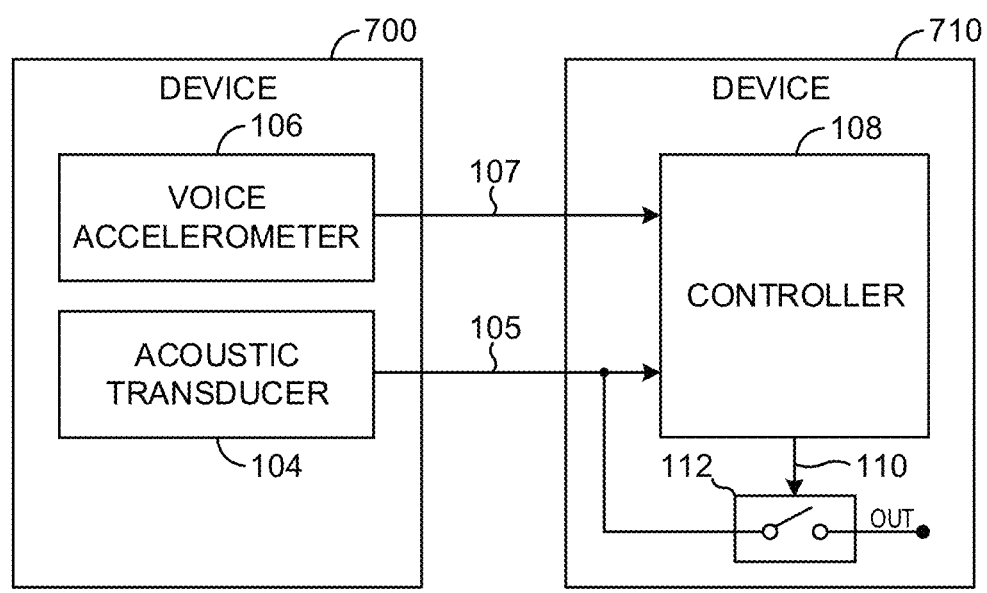

In FIG. 7, a device 700 is shown which includes the acoustic transducer 104 and the voice accelerometer 106. In this example, the signals 105, 107 are provided (e.g., over a wired or wireless communication channel) from the device 700 to a distinct device 710, which can be a mobile device, a laptop, a cloud server, or another processing device. The controller 108 of the device 710 processes the signals 105, 107 in accordance with the techniques described herein to automatically mute or unmute the signal 105 from the acoustic transducer 104.

Figure 8:
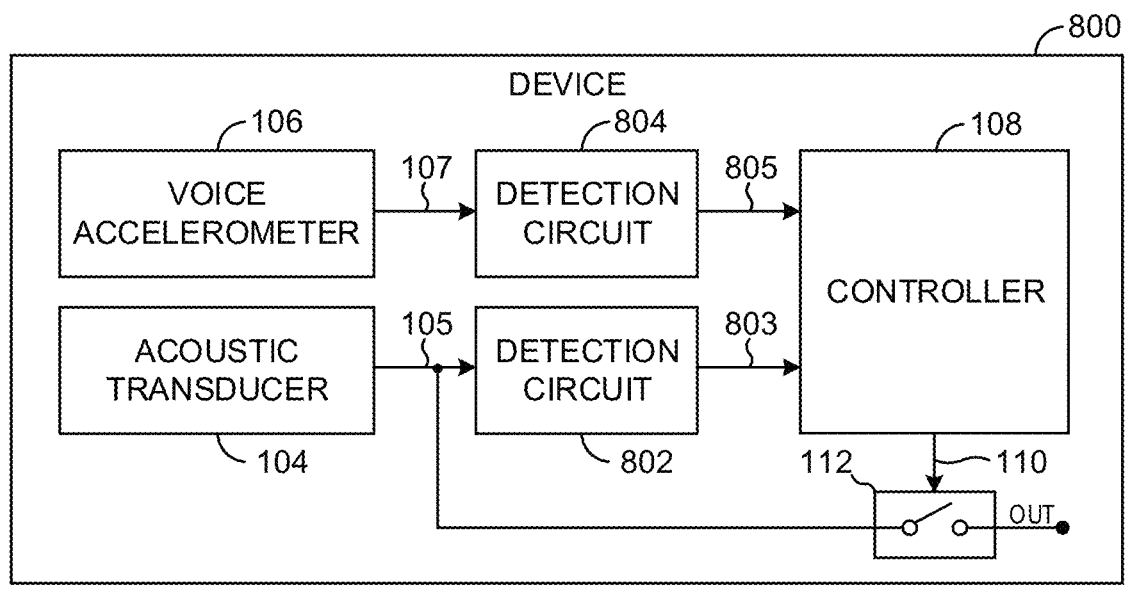

Referring to FIG. 8, a device 800 for automatically muting or unmuting an acoustic transducer is shown which includes detection circuits 802, 804. In this example, the signal 107 from the voice accelerometer 106 is processed by a detection circuit 804 to detect voice activity by a user of the device 800. In some examples, the detection circuit 804 can implement one or more of the techniques described herein to perform voice activity detection. In some examples, the detection circuit 804 can include one or more aspects of the detection circuit described in U.S. patent application Ser. No. 16/900,185, titled "Piezoelectric Accelerometer with Wake Function." An output 805 (e.g., a logic level) from the detection circuit 804 is provided to the controller 108 to indicate whether voice activity is detected from the signal 107.

Similarly, the signal 105 from the acoustic transducer 104 is processed by a detection circuit 802 to detect voice activity by a user of the device 800. To perform voice activity detection, the detection circuit 802 can implement one or more of the techniques described herein and/or described in U.S. patent application Ser. No. 15/930,530, titled "A piezoelectric mems device for producing a signal indicative of detection of an acoustic stimulus," the entire contents of which is incorporated herein by reference. An output 803 (e.g., a logic level) from the detection circuit 802 is provided to the controller to indicate whether voice activity is detected from the signal 105. Based on the signals 803, 805, the controller 108 can detect the presence or absence of voice activity, and can control the output of the acoustic transducer 104 accordingly.

Each of the detection circuits 802, 804 can process the respective signals 105, 107 in the analog or digital domain. In some examples, the detection circuits 802, 804 are combined with each other and/or with the respective acoustic transducer 104 and voice accelerometer 106 (e.g., in a common package or chip). In some examples, the device 800 includes only the detection circuit 802 or only the detection circuit 804.

Figure 9:
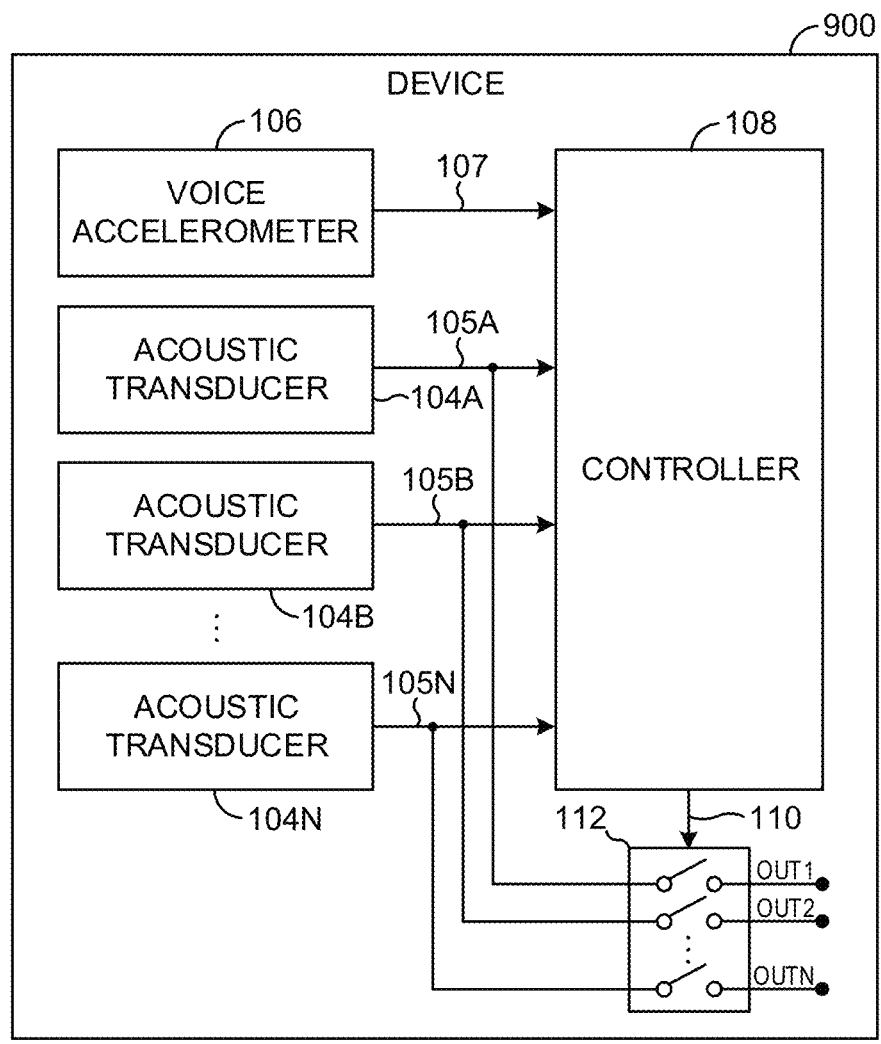

FIG. 9 illustrates a device 900 having an array of acoustic transducers 104A, 104B, . . . , 104N. In this example, the controller 108 can receive the signal 107 from the accelerometer and signals 105A, 105B, . . . , 105N from respective acoustic transducers 104A, 104B, . . . , 104N. The controller 108 can use some or all of the received signals to detect voice activity and can mute or unmute some or all of the acoustic transducers in response. In some examples, the controller 108 can leverage the array of acoustic transducers 104A, 104B, . . . , 104N to perform beamforming techniques and increase the accuracy of voice activity detection (e.g., by directing the detection of acoustic signals to the mouth of the user to maximize the detected voice signal, by directing the detection of acoustic signals to areas of background noise for cancellation, etc.).

Figure 10:
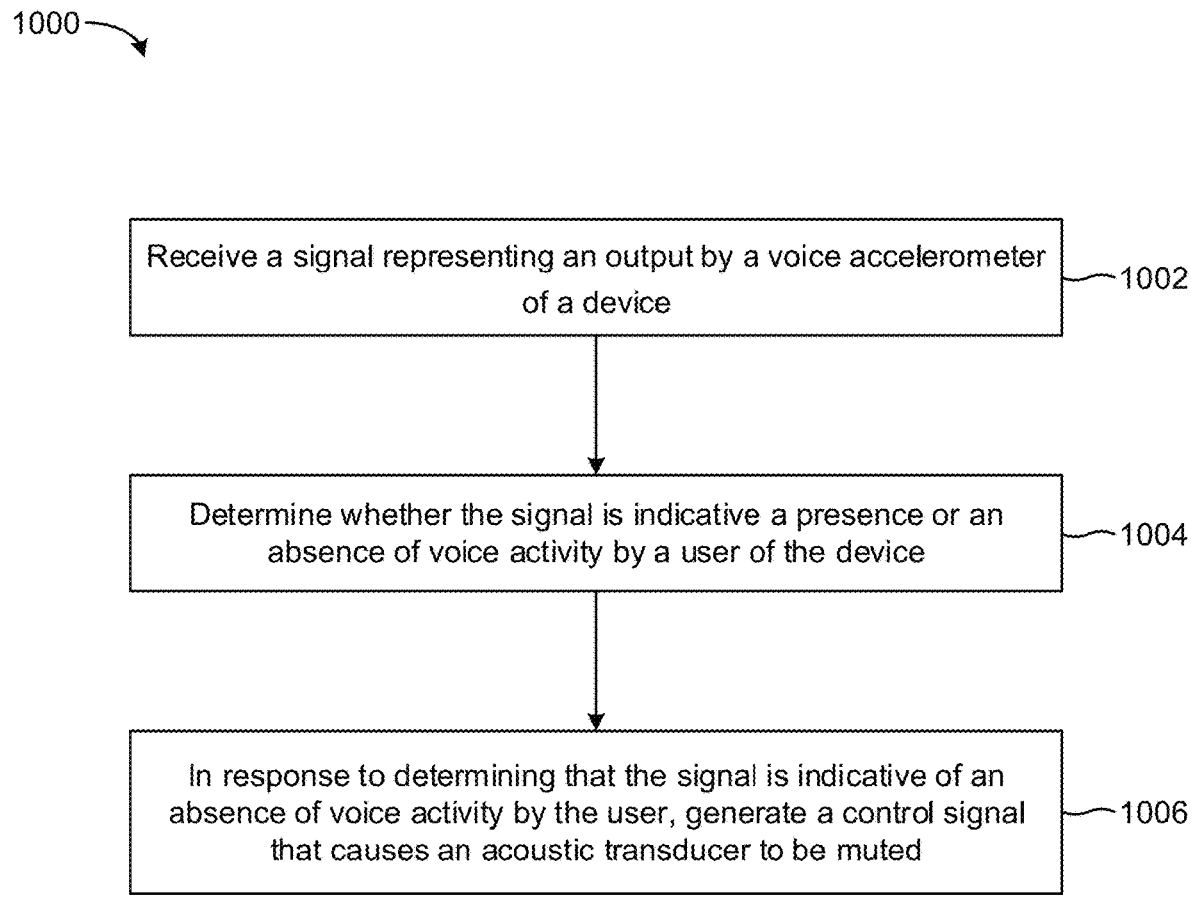
FIG. 10 illustrates an example processes for automatically muting or unmuting an acoustic transducer.

FIG. 10 illustrates an example process 1000 for automatically muting or unmuting an acoustic transducer. In some examples, the electronic device(s), system(s), or component(s), or portions or implementations thereof, of FIGS. 1, 2, 4, and 6-9 are configured to perform the process 1000, such as the controller 108, among others.

Operations of the process 1000 include receiving 1002 a signal representing an output by a voice accelerometer of a device. The device can be, for example, a headset, headphones, earbuds, a wearable device, a mobile device, or another device including one or more of the features described herein. In some examples, the voice accelerometer is a piezoelectric MEMS accelerometer that generates the signal by detecting vibrations of the vocal chords of the user through the device. In some examples, the signal is received by a processor (e.g., the controller 108 or another processing circuit) of the device or another coupled device.

The signal is processed to determine 1004 whether the signal is indicative of a presence or an absence of voice activity by a user of the device. In some examples, determining whether the signal is indicative of a presence or an absence of voice activity by the user includes comparing an amplitude of at least a portion of the signal with a threshold value. In some examples, in response to the amplitude of at least a portion of the signal satisfying the threshold value, an amplitude or energy at one or more particular frequencies of the signal is compared with a threshold value to determine whether the signal is indicative of a presence or an absence of voice activity by the user. In some examples, in response to the amplitude of at least a portion of the signal satisfying the threshold value, a voice activity detection algorithm is applied to the signal to determine whether the signal is indicative of a presence or an absence of voice activity by the user.

At 1006, a control signal that causes an acoustic transducer to be muted is generated in response to determining that the signal is indicative of an absence of voice activity by the user. In some examples, a control signal that causes an acoustic transducer to be unmuted is generated in response to determining that the signal is indicative of a presence of voice activity by the user. The acoustic transducer can be a microphone included in the device that is worn or otherwise in contact with the user or a microphone of another distinct device that is communicatively coupled to the device. In some examples, the acoustic transducer is a piezoelectric MEMS microphone.

In some examples, the control signal controls a hardware or software switch to cause the acoustic transducer to be muted or unmuted. For example, the control signal can modulate a hardware switch at an output of the acoustic transducer or at a power source of the acoustic transducer, or a software switch (e.g., implemented by the controller 108 or an application or service executing on the device or another device) that receives the output of the acoustic transducer. In some examples, the control signal causes the device or another device to display an audio or visual indication that the acoustic transducer is muted or unmuted.

In some examples, the signal representing the output by the voice accelerometer is a first signal, and the process 1000 includes receiving (e.g., by the controller 108) a second signal representing an output by the acoustic transducer of the device, determining a correlation between the first signal and the second signal, and based on the correlation, generating a control signal that causes the acoustic transducer to be muted or unmuted. For example, a control signal that causes the acoustic transducer to be unmuted can be generated in response to the correlation satisfying a threshold value (e.g., representing a threshold level of similarity), or a control signal that causes the acoustic transducer to be muted can be generated in response to the correlation not satisfying a threshold value.

Figure 11:
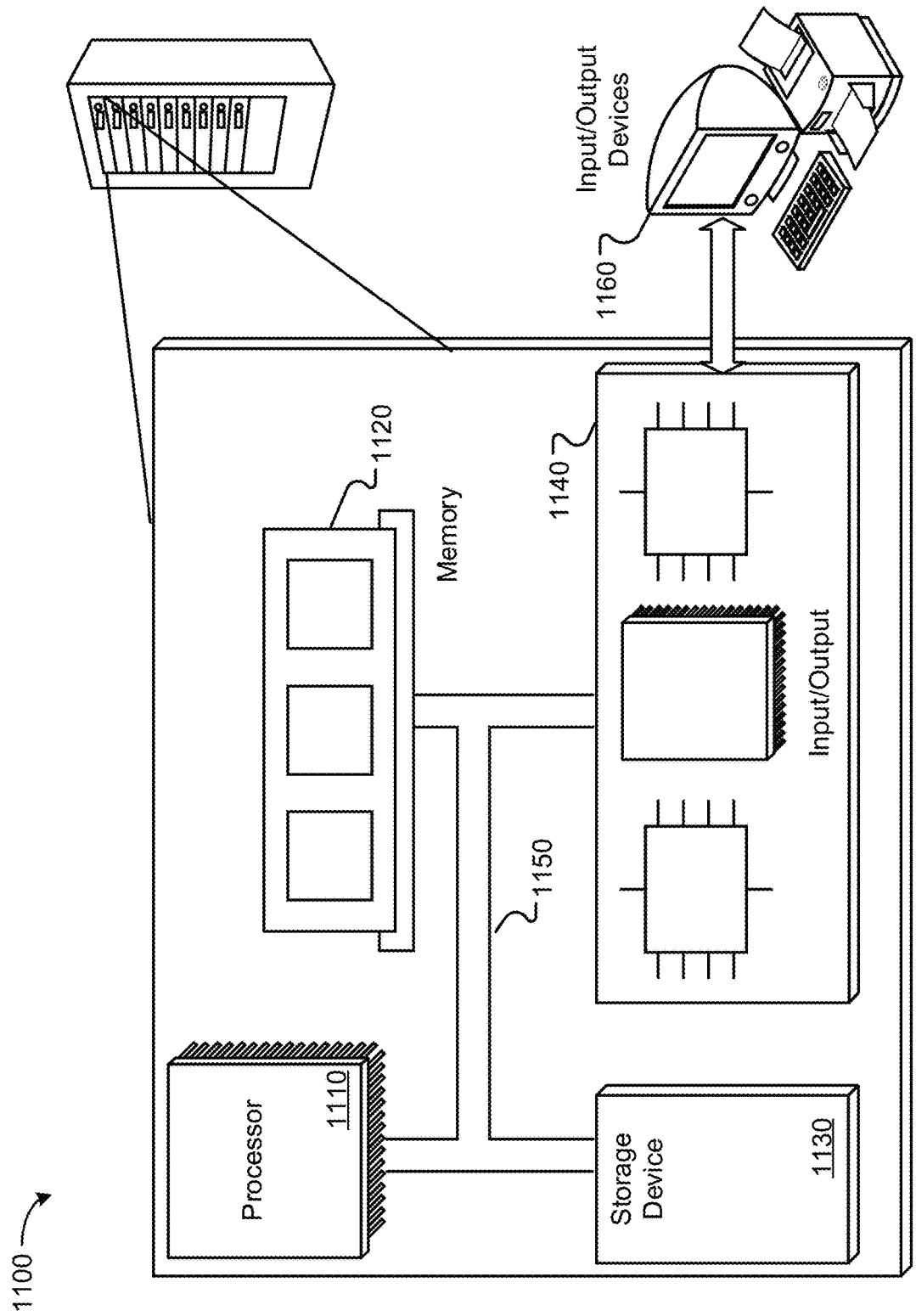
FIG. 11 illustrates an example computer system.

FIG. 11 is a block diagram of an example computer system 1100. For example, referring to FIG. 1, the device 100 or a component thereof, such as the controller 108, could be an example of the system 1100 described here. The system 1100 includes a processor 1110, a memory 1120, a storage device 1130, and one or more input/output interface devices 1140. Each of the components 1110, 1120, 1130, and 1140 can be interconnected, for example, using a system bus 1150.

The processor 1110 is capable of processing instructions for execution within the system 1100. The term "execution" as used here refers to a technique in which program code causes a processor to carry out one or more processor instructions. In some implementations, the processor 1110 is a single-threaded processor. In some implementations, the processor 1110 is a multi-threaded processor. The processor 1110 is capable of processing instructions stored in the memory 1120 or on the storage device 1130. The processor 1110 may execute operations such as those described with reference to FIGS. 5 and 10.

The memory 1120 stores information within the system 1100. In some implementations, the memory 1120 is a computer-readable medium. In some implementations, the memory 1120 is a volatile memory unit. In some implementations, the memory 1120 is a non-volatile memory unit.

The storage device 1130 is capable of providing mass storage for the system 1100. In some implementations, the storage device 1130 is a non-transitory computer-readable medium. In various different implementations, the storage device 1130 can include, for example, a hard disk device, an optical disk device, a solid-state drive, a flash drive, magnetic tape, or some other large capacity storage device. In some implementations, the storage device 1130 may be a cloud storage device, e.g., a logical storage device including one or more physical storage devices distributed on a network and accessed using a network. In some examples, the storage device may store long-term data. The input/output interface devices 1140 provide input/output operations for the system 1100. In some implementations, the input/output interface devices 1140 can include one or more of a network interface devices, e.g., an Ethernet interface, a serial communication device, e.g., an RS-232 interface, and/or a wireless interface device, e.g., an 802.11 interface, a 3G wireless modem, a 4G wireless modem, a 5G wireless modem, etc. A network interface device allows the system 1100 to communicate, for example, transmit and receive data. In some implementations, the input/output device can include driver devices configured to receive input data and send output data to other input/output devices, e.g., keyboard, printer and display devices 1160. In some implementations, mobile computing devices, mobile communication devices, and other devices can be used.

In some examples, the system 1100 is contained within a single integrated circuit package. A system 1100 of this kind, in which both a processor 1110 and one or more other components are contained within a single integrated circuit package and/or fabricated as a single integrated circuit, is sometimes called a controller or microcontroller. In some implementations, the integrated circuit package includes pins that correspond to input/output ports, e.g., that can be used to communicate signals to and from one or more of the input/output interface devices 1140.

Although an example processing system has been described in FIG. 11, implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. In an example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "controller," "data processing apparatus," "computer," and "computing device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as standalone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a GNSS sensor or receiver, or a portable storage device such as a universal serial bus (USB) flash drive.

Computer readable media (transitory or non-transitory, as appropriate) suitable for storing computer program instructions and data can include all forms of permanent/non-permanent and volatile/non-volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/-R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

While this specification includes many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

What is claimed is:

1. A method comprising:
   receiving, by at least one processor of a device, a first signal representing an output by a piezoelectric microelectromechanical system (MEMS) bone conduction sensor of the device;
   receiving, by the at least one processor, a second signal representing an output by a piezoelectric MEMS acoustic transducer of the device, wherein the piezoelectric MEMS acoustic transducer is separate from the piezoelectric MEMS bone conduction sensor;
   determining, by the at least one processor, that the first signal representing the output by the piezoelectric MEMS bone conduction sensor is indicative of an absence of voice activity; and
   in response to determining that the first signal is indicative of an absence of voice activity by a user, generating, by the at least one processor, a control signal that causes the second signal from the piezoelectric MEMS acoustic transducer to be muted.

2. The method of claim 1, further comprising:
   determining, by the at least one processor, a correlation between the first signal and the second signal; and based on the correlation, generating, by the at least one processor, the control signal that causes the piezoelectric MEMS acoustic transducer to be muted or unmuted.

3. The method of claim 2, comprising generating the control signal that causes the piezoelectric MEMS acoustic transducer to be unmuted in response to the correlation satisfying a threshold value.

4. The method of claim 1, comprising:
in response to determining that the first signal is indicative of a presence of voice activity by the user, generating a control signal that causes the piezoelectric MEMS acoustic transducer to be unmuted.

5. The method of claim 1, wherein determining whether the first signal is indicative of a presence or an absence of voice activity comprises comparing an amplitude of at least a portion of the first signal with a threshold value.

6. The method of claim 5, comprising:
in response to the amplitude of at least a portion of the first signal satisfying the threshold value, comparing an amplitude or energy at one or more particular frequencies of the first signal with a threshold value to determine whether the first signal is indicative of a presence or an absence of voice activity by the user.

7. The method of claim 5, comprising:
in response to the amplitude of at least a portion of the first signal satisfying the threshold value, applying a voice activity detection algorithm to the first signal to determine whether the first signal is indicative of a presence or an absence of voice activity by the user.

8. The method of claim 1, wherein the device includes the at least one processor.

9. The method of claim 1, wherein the at least one processor is included in another device that is distinct from the device.

10. The method of claim 1, wherein the piezoelectric MEMS bone conduction sensor generates the first signal by detecting vibrations of vocal chords of the user through the device.

11. The method of claim 1, wherein the control signal controls a hardware or software switch to cause the piezoelectric MEMS acoustic transducer to be muted.

12. The method of claim 1, wherein the control signal causes the device or another device to display an audio or visual indication that the piezoelectric MEMS acoustic transducer is muted or unmuted.

13. A device, comprising:
at least one processor; and
at least one computer-readable storage medium storing instructions that are executable by the at least one processor to perform operations comprising:
receiving a first signal representing an output by a piezoelectric micro-electromechanical system (MEMS) bone conduction sensor of the device;
receiving, by the at least one processor, a second signal representing an output by a piezoelectric MEMS acoustic transducer of the device, wherein the piezoelectric MEMS acoustic transducer is separate from the piezoelectric MEMS bone conduction sensor;
determining that the first signal representing the output by the piezoelectric MEMS bone conduction sensor is indicative of an absence of voice activity; and
in response to determining that the first signal is indicative of an absence of voice activity by a user, generating a control signal that causes the second signal from the piezoelectric MEMS acoustic transducer to be muted.

14. The device of claim 13, further comprising:
determining, by the at least one processor, a correlation between the first signal and the second signal; and
based on the correlation, generating, by the at least one processor, the control signal that causes the piezoelectric MEMS acoustic transducer to be muted or unmuted.

15. The device of claim 13, wherein the piezoelectric MEMS bone conduction sensor and the piezoelectric MEMS acoustic transducer are included in the device.

16. The device of claim 13, wherein the piezoelectric MEMS bone conduction sensor and the piezoelectric MEMS acoustic transducer are included in another device that is distinct from the device.

17. One or more non-transitory computer-readable storage mediums storing instructions that are executable by at least one processor of a device to perform operations comprising:
receiving a first signal representing an output by a piezoelectric micro-electromechanical system (MEMS) bone conduction sensor of the device;
receiving, by the at least one processor, a second signal representing an output by a piezoelectric MEMS acoustic transducer of the device, wherein the piezoelectric MEMS acoustic transducer is separate from the piezoelectric MEMS bone conduction sensor;
determining that the first signal representing the output by the piezoelectric MEMS bone conduction sensor is indicative of an absence of voice activity; and
in response to determining that the first signal is indicative of the absence of voice activity by a user, generating a control signal that causes the second signal from the piezoelectric MEMS acoustic transducer to be muted.

18. The one or more non-transitory computer-readable mediums of claim 17, wherein the instructions are further executable to cause the device to perform operations comprising:
determining, by the at least one processor, a correlation between the first signal and the second signal; and
based on the correlation, generating, by the at least one processor, the control signal that causes the piezoelectric MEMS acoustic transducer to be muted or unmuted.

* * * * *